United States Patent
Kobayashi et al.

(10) Patent No.: US 7,605,662 B2
(45) Date of Patent: Oct. 20, 2009

(54) OSCILLATOR CONTROLLER INCORPORATING A VOLTAGE-CONTROLLED OSCILLATOR THAT OUTPUTS AN OSCILLATION SIGNAL AT A DESIRED OSCILLATION FREQUENCY

(75) Inventors: Hiroyuki Kobayashi, Yokohama (JP); Shouhei Kousai, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 63 days.

(21) Appl. No.: 11/735,559

(22) Filed: Apr. 16, 2007

(65) Prior Publication Data
US 2007/0247248 A1 Oct. 25, 2007

(30) Foreign Application Priority Data
Apr. 19, 2006 (JP) .............................. 2006-115461

(51) Int. Cl.
*H03L 7/00* (2006.01)
(52) U.S. Cl. .............................. 331/11; 331/16; 331/25; 331/167; 331/177 R
(58) Field of Classification Search ................. 331/1 R, 331/11, 12, 14–17, 34, 1 A, 111, 117 R, 117 FE, 331/167, 177 R, 179, 177 V; 327/146–159; 455/260, 262; 375/373–376
See application file for complete search history.

(56) References Cited

U.S. PATENT DOCUMENTS

| | | | | |
|---|---|---|---|---|
| 2001/0052823 | A1* | 12/2001 | Hirano et al. | 331/11 |
| 2005/0237119 | A1* | 10/2005 | Irie | 331/16 |
| 2006/0158264 | A1* | 7/2006 | Kousai et al. | 331/16 |

\* cited by examiner

*Primary Examiner*—James H. Cho
*Assistant Examiner*—Jany Tran
(74) *Attorney, Agent, or Firm*—Oblon, Spivak, McClelland, Maier & Neustadt, L.L.P.

(57) ABSTRACT

An oscillator controller has a phase frequency detector that compares a reference signal and a frequency-divided signal and outputs a phase difference signal; a charge pump; a loop filter that filters the phase error signal output from the charge pump and outputs an oscillation frequency controlling voltage; a voltage-controlled oscillator; a first counter that counts the number of waves of the reference signal to a desired number and outputs a first flag signal; a second counter that counts the number of waves of the frequency-divided signal to the desired number and outputs a second flag signal; a first comparator that compares the first flag signal and the second flag signal and outputs a frequency comparison signal; and a control circuit that controls the voltage-controlled oscillator, the first counter, the second counter and the frequency divider by outputting signals thereto.

3 Claims, 12 Drawing Sheets

→ FREQUENCY OF FREQUENCY-DIVIDED SIGNAL > FREQUENCY OF REFERENCE SIGNAL
--→ FREQUENCY OF FREQUENCY-DIVIDED SIGNAL < FREQUENCY OF REFERENCE SIGNAL

OSCILLATOR CONTROLLER INCORPORATING A VOLTAGE-CONTROLLED OSCILLATOR THAT OUTPUTS AN OSCILLATION SIGNAL AT A DESIRED OSCILLATION FREQUENCY

CROSS-REFERENCE TO RELATED APPLICATION

This application is based upon and claims the benefit of priority from the prior Japanese Patent Application No. 2006-115461, filed on Apr. 19, 2006, the entire contents of which are incorporated herein by reference.

BACKGROUND OF THE INVENTION

1. Field of the Invention

The present invention relates to an oscillator controller incorporating a voltage-controlled oscillator that outputs an oscillation signal at a desired oscillation frequency.

2. Background Art

Recently, for example, in the field of mobile communication, the market of which is rapidly growing, there is an increasing demand that a voltage-controlled oscillator (VCO) be mounted on each mobile communication terminal (see Japanese Patent Laid-Open No. 2006-504352, for example).

The voltage-controlled oscillator is capable of changing the oscillation frequency according to an oscillation frequency controlling voltage.

However, recently, the circuit operating voltage has been lowered, and accordingly, the available range of voltage variation that assures an adequate performance has become narrower. In addition, a wider band of frequencies has come into use. A conventional VCO increases the amount of frequency change per unit voltage. As a result, the sensitivity to the noise on the controlling voltage increases, causing deteriorations of characteristics, such as phase noise and spur.

Thus, in order to reduce the phase noise while widening the frequency band at low voltage, voltage-controlled oscillators have become widely used which have another external control terminal in addition to that for frequency control and can selectively change the oscillation frequency band.

By the way, there is a typical LC resonator that can selectively change the capacitance using a switch to select the oscillation band. If such an LC resonator is used, a sufficient oscillation frequency band can be assured while reducing the frequency change or oscillation frequency controlling voltage change.

However, since the frequency change or oscillation frequency controlling voltage change is reduced, the range of frequency change is reduced when the switch for frequency adjustment is fixed.

Therefore, when using such a circuit, the state of the switch has to be appropriately changed according to the oscillation frequency.

In addition, there is a conventional voltage-controlled oscillator that raises the frequency as the controlling voltage rises. Such a voltage-controlled oscillator compares a reference voltage and an oscillation frequency controlling voltage to make the oscillation frequency controlling voltage fall within an ideal range.

If the oscillation frequency controlling voltage is higher than the reference voltage, a capacitor is opened to raise the frequency to lower the oscillation frequency controlling voltage. If the oscillation frequency controlling voltage is lower than the reference voltage, the capacitor is closed to lower the frequency to lower the oscillation frequency controlling voltage.

The oscillation frequency adjustment method of the conventional voltage-controlled oscillator has a problem that the time required for the adjustment depends on the characteristics of a phase locked loop (PLL).

Specifically, since the value of the oscillation frequency controlling voltage is used as it is, when the switch circuit for controlling the composite capacitance is set at a certain value, the time required for determining the result of comparison between the reference voltage and the oscillation frequency controlling voltage depends on the constants of circuits constituting the PLL.

Furthermore, there is another conventional voltage-controlled oscillator that, when setting the capacitance of the VCO, stops a phase frequency detector, compares the reference voltage and the oscillation frequency controlling voltage in synchronization with the reference signal, and drives a charge pump based on the result of the comparison to make the oscillation frequency controlling voltage nearly equal to the reference voltage (reference voltage≦oscillation frequency controlling voltage).

In addition, the output of a prescaler, rather than the output of a frequency divider, is counted. At this time, the frequency of the VCO can be accurately determined by checking the control signal for the prescaler at the same time.

With such a configuration, the comparison can be carried out within a shorter time than the case where the output of the frequency divider is used for the comparison. And the charge pump is shared, so that the deteriorations of the characteristics due to addition of an extra circuit, such as a switch, described above can be avoided.

However, in the case where the output of the prescaler is compared with the reference signal, the output frequency of the prescaler and the output frequency of the reference signal naturally differ from each other by an amount which is counted by a pulse swallow counter.

In particular, in the case of the fractional-N PLL using a sigma delta modulator, settings of the pulse swallow counter are various.

Therefore, in order to provide an accurate comparison coefficient, calculations have to be carried out again from setting values of the PLL. As a result, the circuit size increases, and a comparison error occurs depending on the selection of the frequency used as a reference frequency.

SUMMARY OF THE INVENTION

According one aspect of the present invention, there is provided: an oscillator controller, comprising a phase frequency detector that compares a reference signal and a frequency-divided signal and outputs a phase difference signal; a charge pump that outputs a phase error signal according to the phase difference signal output from said phase frequency detector; a loop filter that filters the phase error signal output from said charge pump and outputs an oscillation frequency controlling voltage; a voltage-controlled oscillator that has an LC resonator having a coil, a variable capacitor connected to the opposite ends of the coil at the opposite ends thereof, and a capacitor connected in series with a switch between the opposite ends of said variable capacitor, the oscillation frequency of the voltage-controlled oscillator being controlled through adjustment of the capacitance value of said variable capacitor by said oscillation frequency controlling voltage; a frequency divider that divides the frequency of the output of said voltage-controlled oscillator and outputs said frequency-divided signal; a first counter that counts the number of waves of said reference signal to a desired number and outputs a first flag signal; a second counter that counts the number of waves of said frequency-divided signal to said desired number and outputs a second flag signal; a first comparator that compares said first flag signal and said second flag signal and outputs a frequency comparison signal; and a control circuit that controls said voltage-controlled oscillator, said first counter, said second counter and said frequency divider by outputting signals thereto.

According another aspect of the present invention, there is provided: an oscillator controller, comprising a phase frequency detector that compares a reference signal and a frequency-divided signal and outputs a phase difference signal; a charge pump that outputs a phase error signal according to the phase difference signal output from said phase frequency detector; a loop filter that filters the phase error signal output from said charge pump and outputs an oscillation frequency controlling voltage; a voltage-controlled oscillator whose oscillation frequency is controlled by said oscillation frequency controlling voltage; a frequency divider having a prescaler that counts the number of waves of an oscillation signal output from said voltage-controlled oscillator and a pulse swallow counter that receives the output of the prescaler, controls the frequency division ratio of said prescaler, and outputs said frequency-divided signal according to the output of said prescaler; a first counter that counts the number of waves of said reference signal to a desired number and outputs a first flag signal; a second counter that counts the number of waves of said frequency-divided signal to said desired number and outputs a second flag signal; a first comparator that compares said first flag signal and said second flag signal and outputs a frequency comparison signal; and a control circuit that controls said voltage-controlled oscillator, said first counter, said second counter and said frequency divider by outputting signals thereto.

According still further aspect of the present invention, there is provided: an oscillator controller, comprising a phase frequency detector that compares a reference signal and a frequency-divided signal and outputs a phase difference signal; a charge pump that outputs a phase error signal according to the phase difference signal output from said phase frequency detector; a loop filter that filters the phase error signal output from said charge pump and outputs an oscillation frequency controlling voltage; a ring oscillator that has a switch for selecting one of a plurality of fixed voltages and outputting the selected fixed voltage, a first transistor that has one end connected to a power supply potential and is controlled by the output voltage of the switch, a second transistor that has one end connected to said power supply potential and is controlled by said oscillation frequency controlling voltage, and an odd number of inverters connected to each other in a ring arrangement each of which is connected to the other ends of the first and second transistors to be supplied with electric power, the oscillation frequency of the ring oscillator being controlled through adjustment of said fixed voltage applied to said first transistor by said oscillation frequency controlling voltage; a frequency divider that divides the frequency of the output of said ring oscillator and outputs said frequency-divided signal; a first counter that counts the number of waves of said reference signal to a desired number and outputs a first flag signal; a second counter that counts the number of waves of said frequency-divided signal to said desired number and outputs a second flag signal; a first comparator that compares said first flag signal and said second flag signal and outputs a frequency comparison signal; and a control circuit that controls said ring oscillator, said first counter, said second counter and said frequency divider by outputting signals thereto.

DETAILED DESCRIPTION

The present invention provides an oscillator controller that can precisely control a voltage-controlled oscillator with reduced circuit area and power consumption.

Specifically, first, in control of a VCO capable of changing the oscillation frequency band according to an external control input, the oscillation frequency band is controlled based on comparison between the phase of a reference signal and the phase of a VCO output or a frequency-divided signal thereof, the operation of a frequency divider is synchronized with the phase of the reference signal in the phase comparison. Therefore, the VCO can be precisely controlled within a short time.

Second, the frequency divider is configured to operate in the same conditions during comparison in frequency between the VCO output and the reference signal and during normal PLL operation. Therefore, one common circuit suffices for the frequency dividing operation, the circuit is simplified, the footprint thereof is reduced, and the power consumption is reduced.

Third, in setting of an initial controlling voltage of the VCO, a charge pump is shared by a control circuit and a PLL operation circuit during voltage control. Therefore, the effect of addition of the voltage control circuit on the circuit operation and the increase of the implementation area due to addition of the voltage control circuit are reduced.

In the following, embodiments of the present invention will be described with reference to the drawings.

Embodiment 1

With regard to an embodiment 1, there will be described a case where the frequency of a digital control PLL is low, and a signal with a sufficient amplitude can be extracted.

Figure 1:
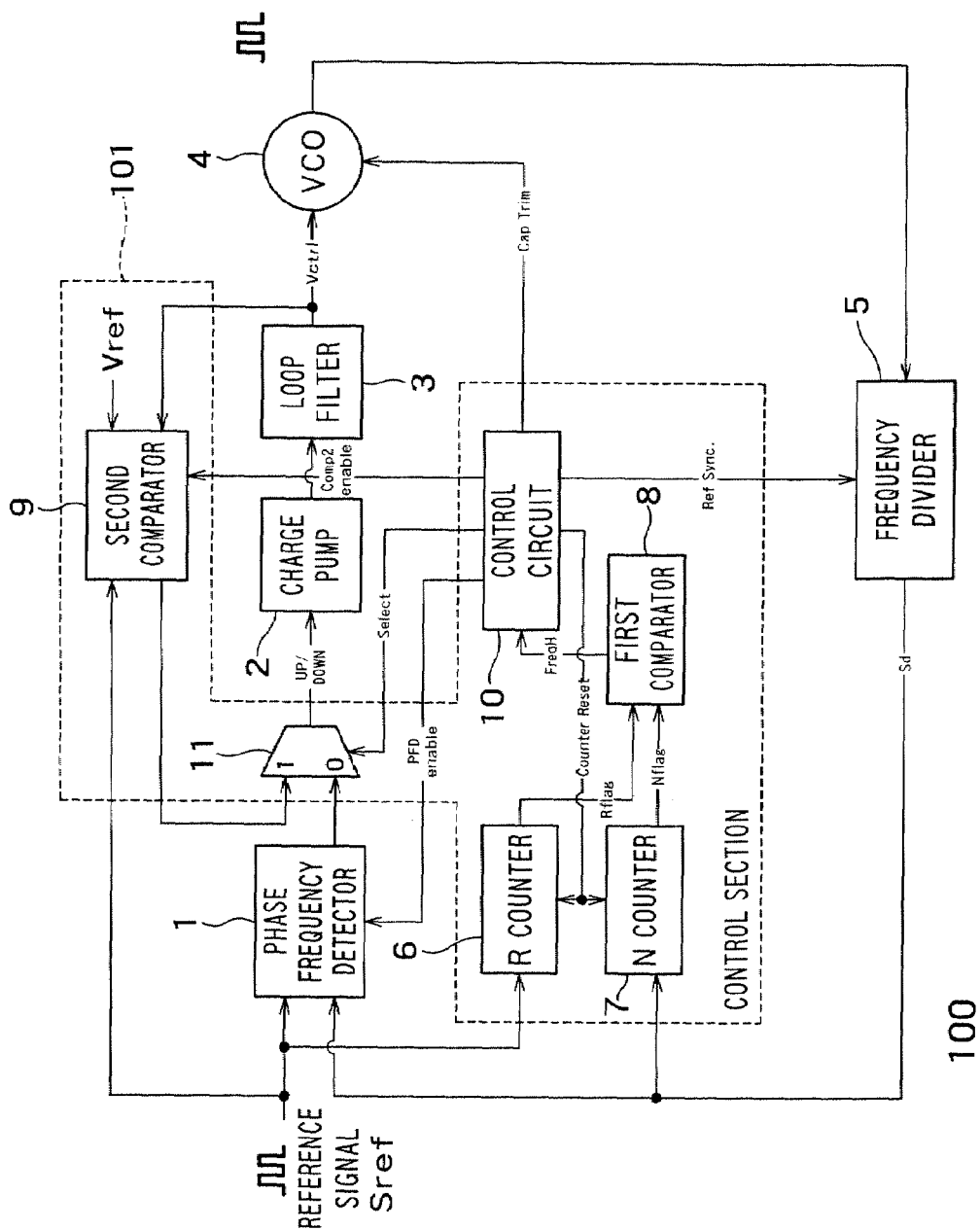
FIG. 1 is a diagram showing essential parts of an oscillator controller 100 according to the embodiment 1 of the present invention.

FIG. 1 is a diagram showing essential parts of an oscillator controller 100 according to the embodiment 1 of the present invention.

As shown in FIG. 1, the oscillator controller 100 has a phase frequency detector 1 that compares a reference signal "Sref" and a frequency-divided signal "Sd" and outputs a phase difference signal, a charge pump 2 that outputs a phase error signal based on the phase difference signal output from the phase frequency detector 1, and a loop filter 3 that filters the phase error signal output from the charge pump and outputs an oscillation frequency controlling voltage "Vctrl".

Furthermore, the oscillator controller 100 has a voltage-controlled oscillator 4 which has an LC resonator and whose oscillation frequency is controlled through adjustment of the capacitance value of a variable capacitor according to the oscillation frequency controlling voltage "Vctrl" and a frequency divider 5 that divides the frequency of the output of the voltage-controlled oscillator 4 and outputs the frequency-divided signal "Sd" described above.

Figure 2:
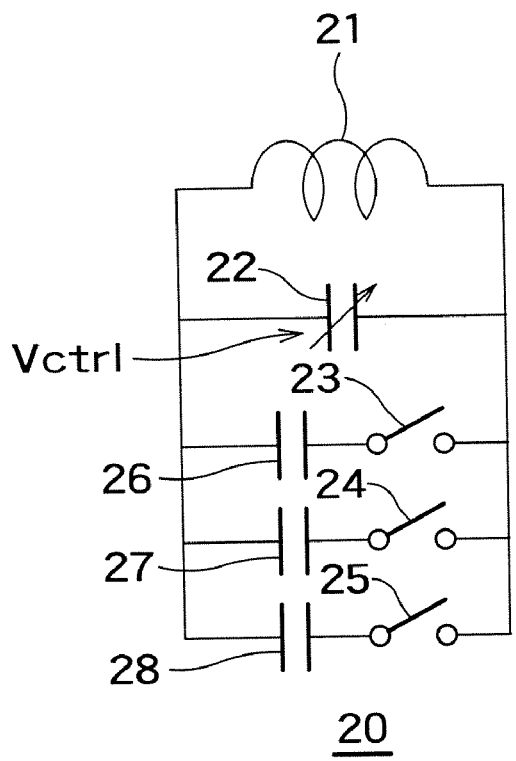
FIG. 2 is a diagram showing essential parts of the LC resonator of the voltage-controlled oscillator 4 shown in FIG. 1.
Figure 3:
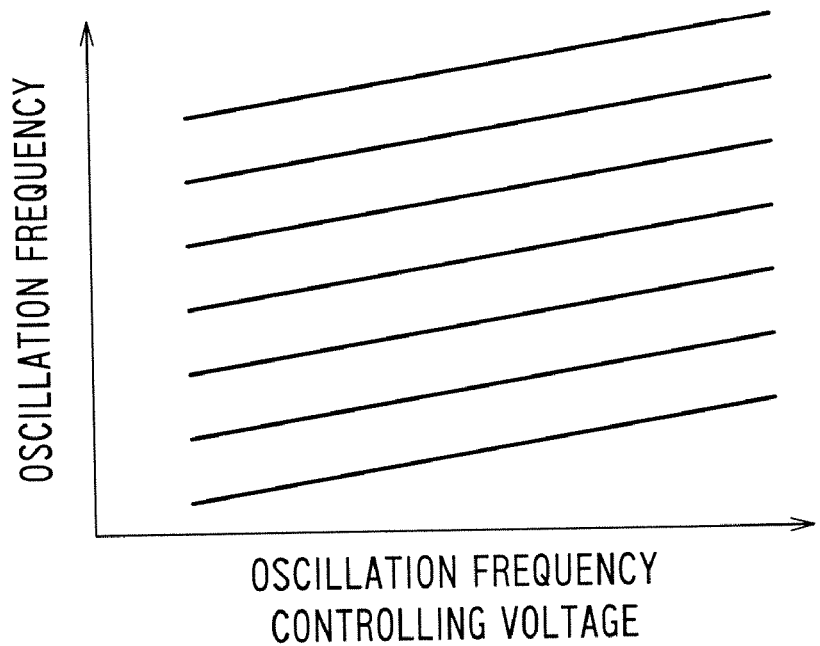
FIG. 3 is a diagram showing oscillation frequency characteristics of the LC resonator shown in FIG. 2.

FIG. 2 is a diagram showing essential parts of the LC resonator of the voltage-controlled oscillator 4 shown in FIG. 1. FIG. 3 is a diagram showing oscillation frequency characteristics of the LC resonator shown in FIG. 2.

As shown in FIG. 2, an LC resonator 20 has a coil 21, a variable capacitor 22 connected to the opposite ends of the coil 21 at the opposite ends thereof, and capacitors 26, 27 and 28 connected between the opposite ends of the variable capacitor 22 in series with switches 23, 24 and 25, respectively.

The LC resonator 20 can change the oscillation frequency band by turning on and off the switches 23, 24 and 25, as shown in FIG. 3. In other words, the LC resonator 20 can roughly adjust the oscillation frequency. Furthermore, the LC resonator 20 can also control the oscillation frequency controlling voltage "Vctrl" input to the variable capacitor 22 to adjust the oscillation frequency. In other words, the LC resonator 20 can finely adjust the oscillation frequency.

Furthermore, the oscillator controller 100 has an R counter 6, which is a first counter that counts the number of waves of the reference signal "Sref" to a desired number and outputs a first flag signal "Rflag", and an N counter 7, which is a second counter that counts the number of waves of the frequency-divided signal "Sd" to a desired number and outputs a second flag signal "Nflag".

Here, the R counter 6 and the N counter 7 have the same circuit configuration.

Furthermore, the oscillator controller 100 includes a control section 101 having a first comparator 8 that compares the first flag signal "Rflag" and the second flag signal "Nflag" and outputs a frequency comparison signal, a second comparator 9 that receives a reference voltage "Vref" and the oscillation frequency controlling voltage "Vctrl" and outputs a signal synchronized with the reference signal "Sref", a control circuit 10 that controls the voltage-controlled oscillator 4, the R counter 6, the N counter 7, the frequency divider 5, and the second comparator 9 by outputting signals thereto, and a multiplexer 11 that outputs, to the charge pump 2, one of the output signal from the second comparator 9 and the output signal from the phase frequency detector 1 which is selected according to a selection signal from the control circuit 10.

Figure 4:
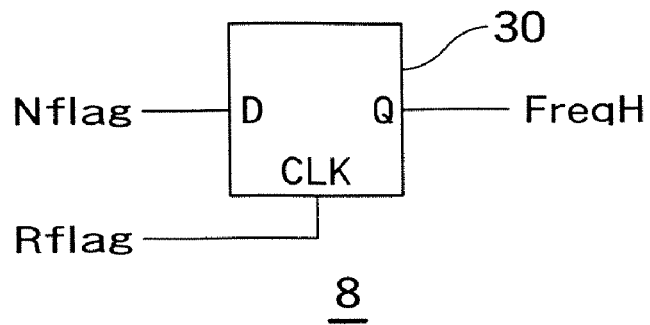
FIG. 4 is a diagram showing an exemplary configuration of essential parts of the first comparator 8 of the oscillator controller 100.

FIG. 4 is a diagram showing an exemplary configuration of essential parts of the first comparator 8 of the oscillator controller 100.

As shown in FIG. 4, the first comparator 8 has a D flip flop 30 that receives the first flag signal "Rflag" at a CLK terminal and the second flag signal "Nflag" as data at a D terminal and outputs a frequency comparison signal "FreqH" according to these inputs.

The D flip flop 30 is configured to determine whether the first flag signal "Rflag" or the second flag signal "Nflag" is advanced in output phase.

Figure 5:
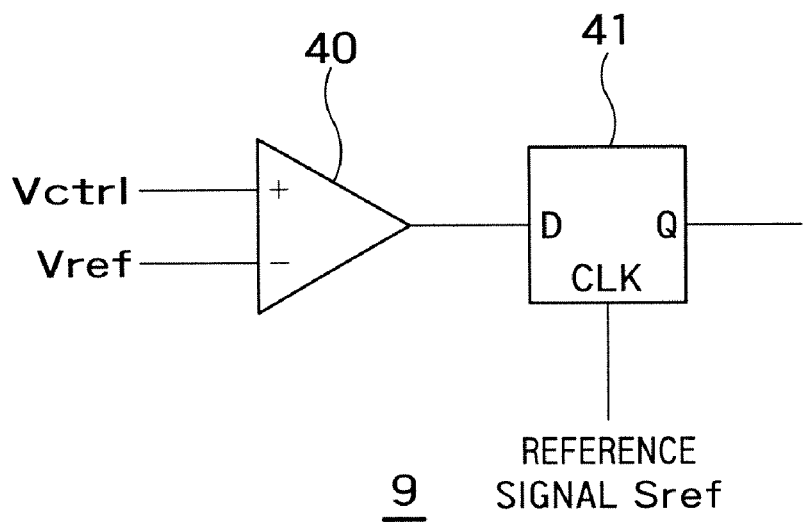
FIG. 5 is a diagram showing an exemplary configuration of essential parts of the second comparator 9 of the oscillator controller 100.
Figure 6:
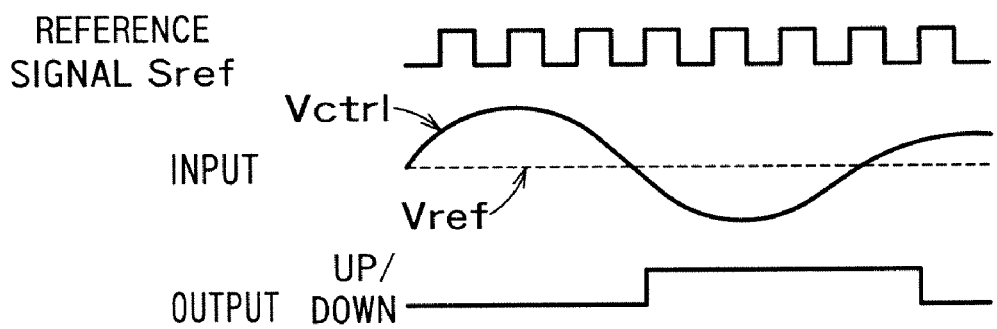
FIG. 6 is a diagram showing an exemplary waveform of signals input to and output from the second comparator 9 shown in FIG. 5.

FIG. 5 is a diagram showing an exemplary configuration of essential parts of the second comparator 9 of the oscillator controller 100. FIG. 6 is a diagram showing an exemplary waveform of signals input to and output from the second comparator 9 shown in FIG. 5.

As shown in FIG. 5, the second comparator 9 has a comparator 40 that receives the oscillation frequency controlling voltage "Vctrl" at a non-inverting input terminal and the reference voltage "Vref" at the inverting input terminal and a D flip flop 41 that receives the output of the comparator 40 at a D terminal and the reference signal "Sref" at a CLK terminal and outputs a signal to the multiplexer 11.

As shown in FIG. 6, the second comparator 9 determines whether the oscillation frequency controlling voltage "Vctrl" or the reference voltage "Vref" is greater in synchronization with the reference signal "Sref". If the oscillation frequency controlling voltage "Vctrl" is greater than the reference voltage "Vref", the comparator 9 outputs a DOWN signal to the charge pump 2 via the multiplexer 11. On the other hand, if the oscillation frequency controlling voltage "Vctrl" is smaller than the reference signal "Vref", the comparator 9 outputs an UP signal to the charge pump 2 via the multiplexer 11.

Now, there will be described a process flow in which the oscillator controller 100 configured as described above controls the voltage-controlled oscillator 4 before proceeding to a PLL operation.

Figure 7:
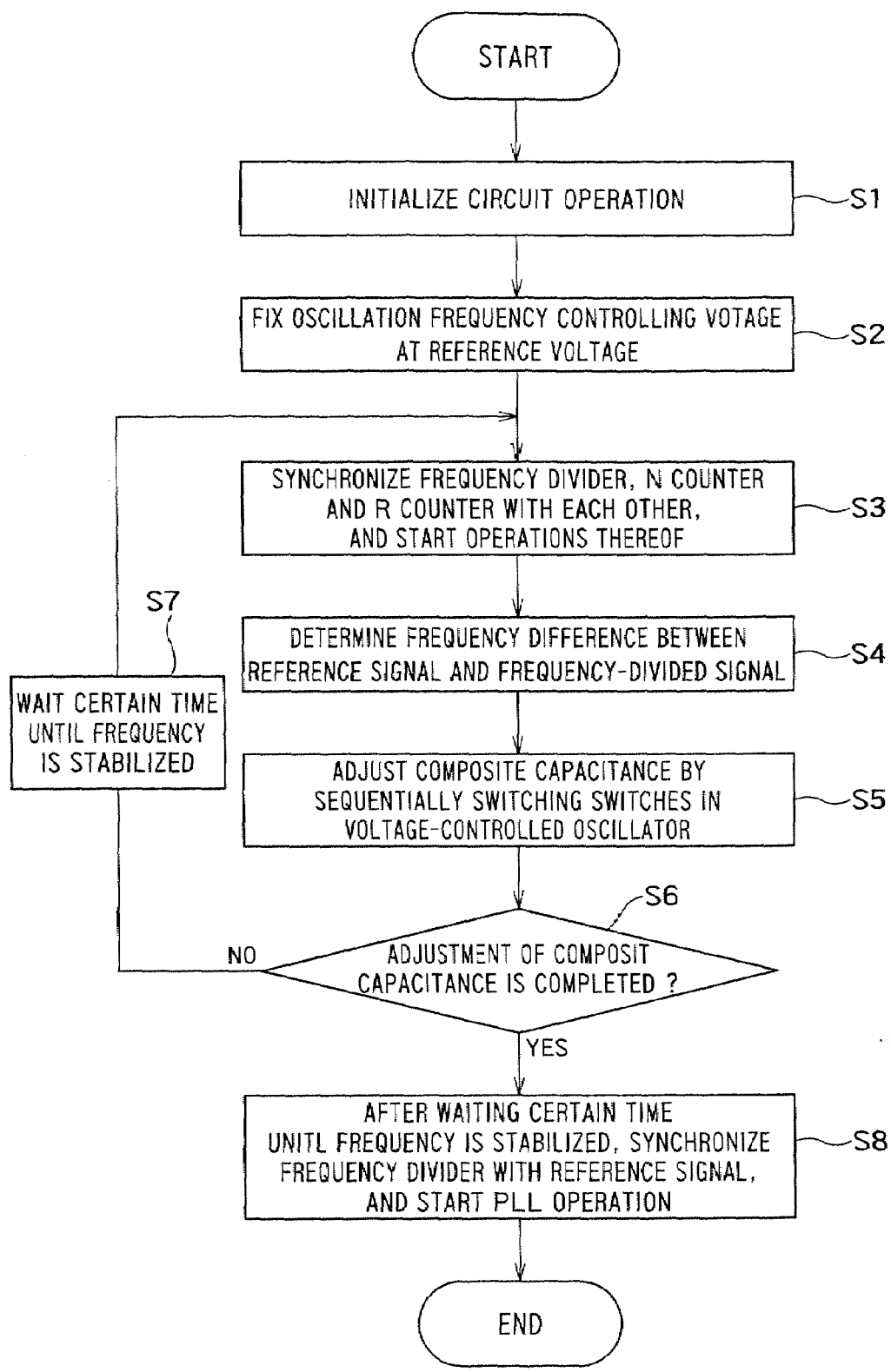
FIG. 7 is a flowchart showing a process in which the oscillator controller according to the embodiment 1 controls the voltage-controlled oscillator.
Figure 8A:
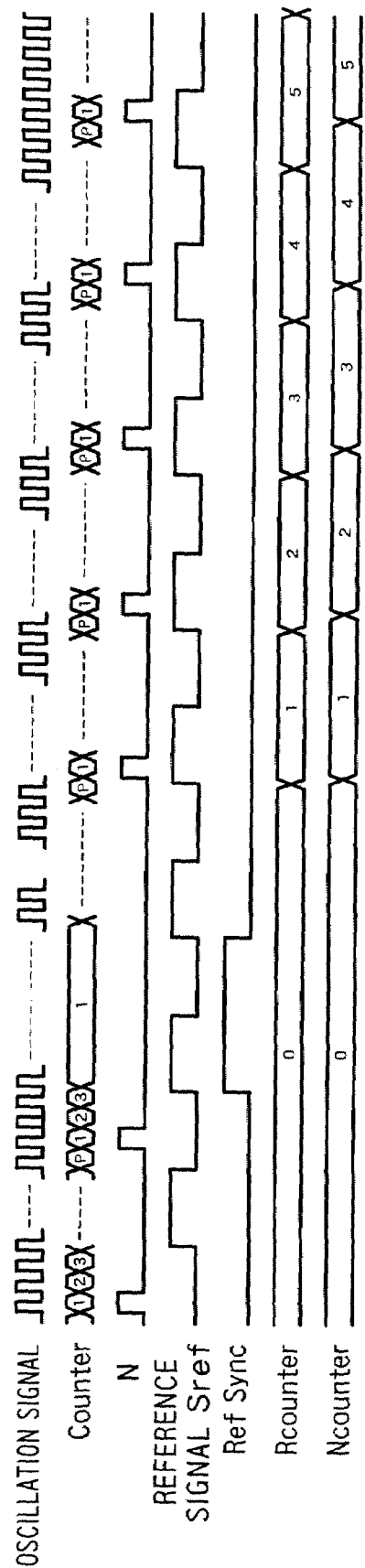
FIG. 8A is timing chart showing waveforms of signals for the oscillator controller 100 to control the voltage-controlled oscillator 4.
Figure 8B:
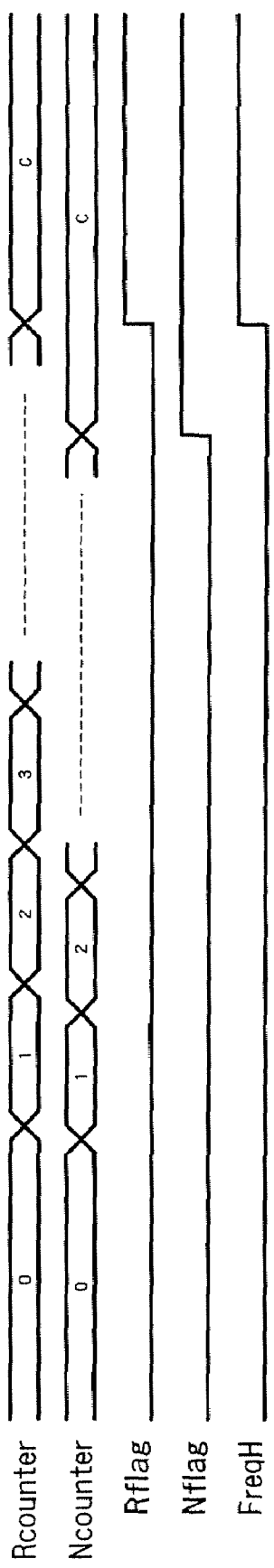
FIG. 8B is timing chart showing waveforms of signals for the oscillator controller 100 to control the voltage-controlled oscillator 4.

FIG. 7 is a flowchart showing a process in which the oscillator controller according to the embodiment 1 controls the voltage-controlled oscillator. FIGS. 8A and 8B are timing charts showing waveforms of signals for the oscillator controller 100 to control the voltage-controlled oscillator 4.

As shown in FIG. 7, first, the oscillator controller 100 performs operation initialization (step "S1"). Specifically, when an oscillation frequency is set, the oscillator controller 100 outputs a control signal to the phase frequency detector 1 to stop the operation thereof and sets the most significant bit (MSB) at the VCO control terminal of the voltage-controlled oscillator 4 at "1" and all the remaining bits at "0".

Figure 9A:
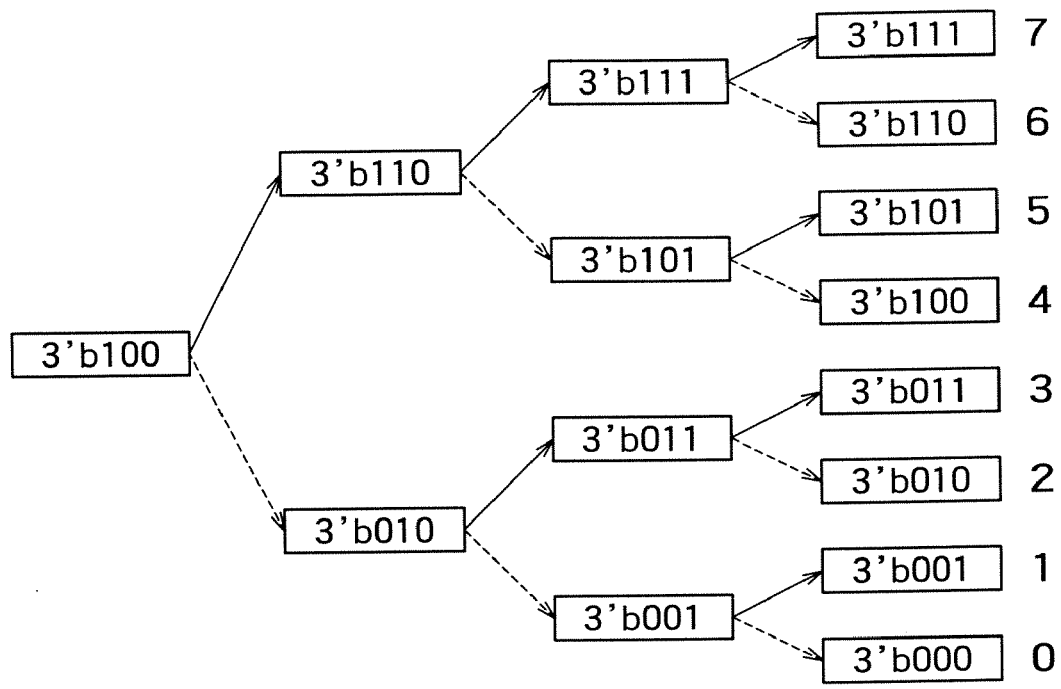
FIG. 9A is a diagram showing a process flow of determining the bits of a 3-bit control signal "Cap Trim"
Figure 9B:
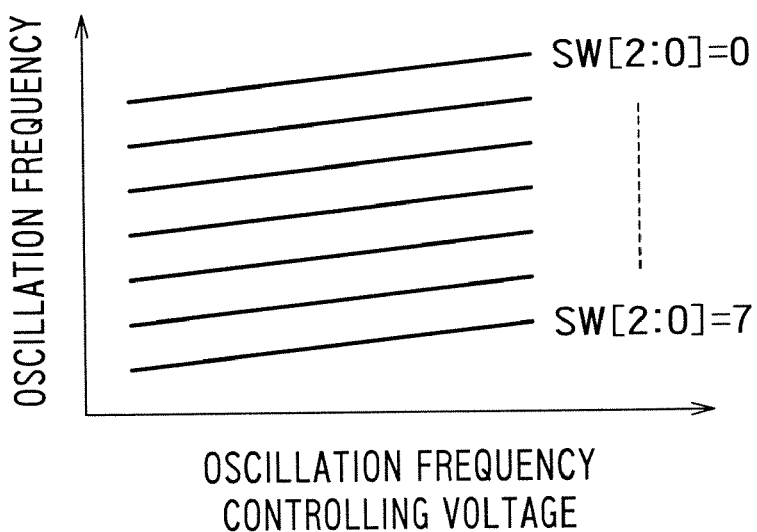
FIG. 9B is a diagram showing oscillation frequency characteristics of the voltage-controlled oscillator 4.

FIG. 9A is a diagram showing a process flow of determining the bits of a 3-bit control signal "Cap Trim". FIG. 9B is a diagram showing oscillation frequency characteristics of the voltage-controlled oscillator 4. As shown in FIGS. 9A and 9B, the amount of change of the frequency of the voltage-controlled oscillator 4 is maximum when the MSB changes, for example. When the control signal is "1", the switch 23 ("SW[0]"), the switch 24 ("SW[1]") and the switch 25 ("SW[2]") are switched to add the capacitors 26, 27 and 28, respectively, thereby reducing the oscillation frequency.

Then, the oscillation frequency controlling voltage "Vctrl" is fixed at the reference voltage (step "S2"). In other words, the control circuit 10 outputs a control signal "select" to the multiplexer 11 to select the input "1" of the multiplexer 11. Then, the control circuit 10 sets a control signal "Comp2enable" at "High" to start the operation of the second comparator 9.

The second comparator 9 outputs the UP/DOWN signal to the charge pump 2 via the multiplexer 11. As a result, the charge pump 2 performs a boosting operation or a step-down operation, thereby controlling the oscillation frequency controlling voltage "Vctrl" output from the loop filter 3 so that the oscillation frequency controlling voltage "Vctrl" approaches the reference voltage "Vref".

Then, after a lapse of a certain time to wait until the oscillation frequency controlling voltage "Vctrl" nearly equals to the reference voltage "Vref" ("Vctrl"≦"Vref"), the control circuit 10 sets the control signal "Comp3enable" at "Low" to stop the operation of the second comparator 9.

Then, a counter in the frequency divider 5 (not shown), the N counter 7 and the R counter 6 are synchronized with each other, and operations thereof are started (step "S3"). The control circuit 10 determines the frequency difference between the reference signal "Sref" and the frequency-divided signal "Sd" based on a first frequency comparison signal "FreqH" and outputs a control signal "Ref Sync" for synchronizing the frequency-divided signal "Sd" with the reference signal "Sref" to the frequency divider 5.

Specifically, the control circuit 10 sets a control signal "Counter Reset" and the control signal "Ref Sync" at "High", sets the N counter 7 and the R counter at an initial value, and maintains the frequency divider 5 at a frequency division ratio in the normal operation. The control signal "Ref Sync" is synchronized with the reference signal "Sref", and when the control signal "Ref Sync" becomes "Low", the operation of the frequency divider 5 is started. At this time, the frequency divider 5 starts the operation in synchronization with the reference signal "Sref".

Under these conditions, the R counter 6 and the N counter 7 are operated. Then, a first flag signal "Rflag" and a second flag signal "Nflag" are set at "Low" under the control of the control signal "Counter Reset" output from the control circuit 10, and when the count reaches to an arbitrary preset value "C", the flag signals are set at "High".

Then, the frequency difference between the reference signal "Sref" and the frequency-divided signal "Sd" after the frequency divider 5, the N counter 7 and the R counter 6 are synchronized with each other is determined (step "S4"). After the reference signal "Sref" and the frequency-divided signal "Sd" are synchronized with each other, the control circuit 10 controls the R counter 6 and the N counter 7 to count the number of waves of the reference signal "Sref" and the frequency-divided signal "Sd", respectively, to a desired number.

Then, based on a second frequency comparison signal "FreqH" output from the first comparator 8 after the synchronization, the control circuit 10 determines the frequency difference between the reference signal "Sref" and the frequency-divided signal "Sd".

Then, the switches 23, 24 and 25 in the voltage-controlled oscillator 4 are switched sequentially as shown in FIGS. 9A and 9B described above, for example, thereby adjusting the composite capacitance of the resonator circuit 20 (step "S5").

Specifically, the control circuit 10 outputs the control signal "Cap Trim" for controlling the ON/OFF state of the switches 23, 24 and 25 to the voltage-controlled oscillator 4 according to the frequency difference between the reference signal "Sref" and the frequency-divided signal "Sd", thereby controlling the oscillation frequency of the voltage-controlled oscillator 4.

For example, if the second frequency comparison signal "FreqH" is "High", it means that the oscillation frequency of the voltage-controlled oscillator 4 is higher than the preset frequency described above, and for example, the MSB at the control terminal is held at "1". Otherwise, the MSB at the control terminal is set at "0", and the following bit is set at "1" (see FIG. 8A).

Then, it is determined whether adjustment of the composite capacitance of the voltage-controlled oscillator 4 is completed (step "S6"). Specifically, the control circuit 10 determines whether the states of the switches 23, 24 and 25 are determined at the VCO control terminal of the voltage-controlled oscillator 4 up to the least significant bit (LSB).

If the adjustment of the composite capacitance of the voltage-controlled oscillator 4 is not completed, or in this embodiment, if the states of the switches 23, 24 and 25 are not determined, a certain time is waited until the frequency is stabilized (step "S7"), and then the process returns to step "S3".

On the other hand, if the adjustment of the composite capacitance of the voltage-controlled oscillator 4 is completed, or in this embodiment, if the states of the switches 23, 24 and 25 are determined, after a certain time is waited until the frequency is stabilized, the frequency divider is synchronized with the reference signal, and the PLL operation is started (step "S8").

Specifically, when the state of the switches 23, 24 and 25 are determined, the control circuit 10 makes the frequency-divided signal "Sd" from the frequency divider 5 and the reference signal "Sref" in phase with each other using the control signal "Ref Sync". In addition, the control circuit 10 outputs the control signal "Select" to select the input "0" of the multiplexer 11, sets a control signal "PFD-Enable" at "High" to start the PLL operation, and proceeds to a normal lock-up operation.

As described above, the N counter 7 is used as a counter that is a reference for comparison and serves also as the counter in the frequency divider 5. Therefore, the circuit size is prevented from increasing. Furthermore, since the control signal "Ref Sync" is used for phase matching, even if the reference signal "Sref" is at a low frequency, the frequency difference between the reference signal "Sref" and the frequency-divided signal "Sd" can be precisely determined within a sufficiently short time.

Furthermore, since one circuit functions both as the circuit for controlling the voltage-controlled oscillator 4 and as the circuit for the PLL operation, the circuit for controlling the voltage-controlled oscillator 4 can operate with the same settings as those during the normal PLL operation. Therefore, there is no need to separately set a frequency ratio between the frequency-divided signal "Sd" output from the frequency divider 5 and the reference signal "Sref" for the circuit for controlling the voltage-controlled oscillator 4.

In addition, the result of comparison between the oscillation frequency controlling voltage "Vctrl" and the reference voltage "Vref" is reflected in the control of the oscillation frequency controlling voltage "Vctrl" via the charge pump 2. As a result, the effect of noise on the oscillation frequency controlling voltage "Vctrl" due to an extra circuit component can be minimized while reducing the increase in circuit area.

In addition, since each of the operations and comparisons is performed with reference to the reference signal "Sref", the voltage-controlled oscillator 4 can be controlled within a fixed length of time without being affected by a process fluctuation or a utilization change.

As described above, the oscillator controller according to this embodiment can precisely control the voltage-controlled oscillator with reduced circuit area and power consumption.

Embodiment 2

With regard to the embodiment 1, there has been described a case where the frequency of a digital control PLL is low, and a signal with a sufficient amplitude can be extracted. In the following, there will be described a case where the frequency of the PLL is high, and the frequency divider has a prescaler and a pulse swallow counter.

Figure 10:
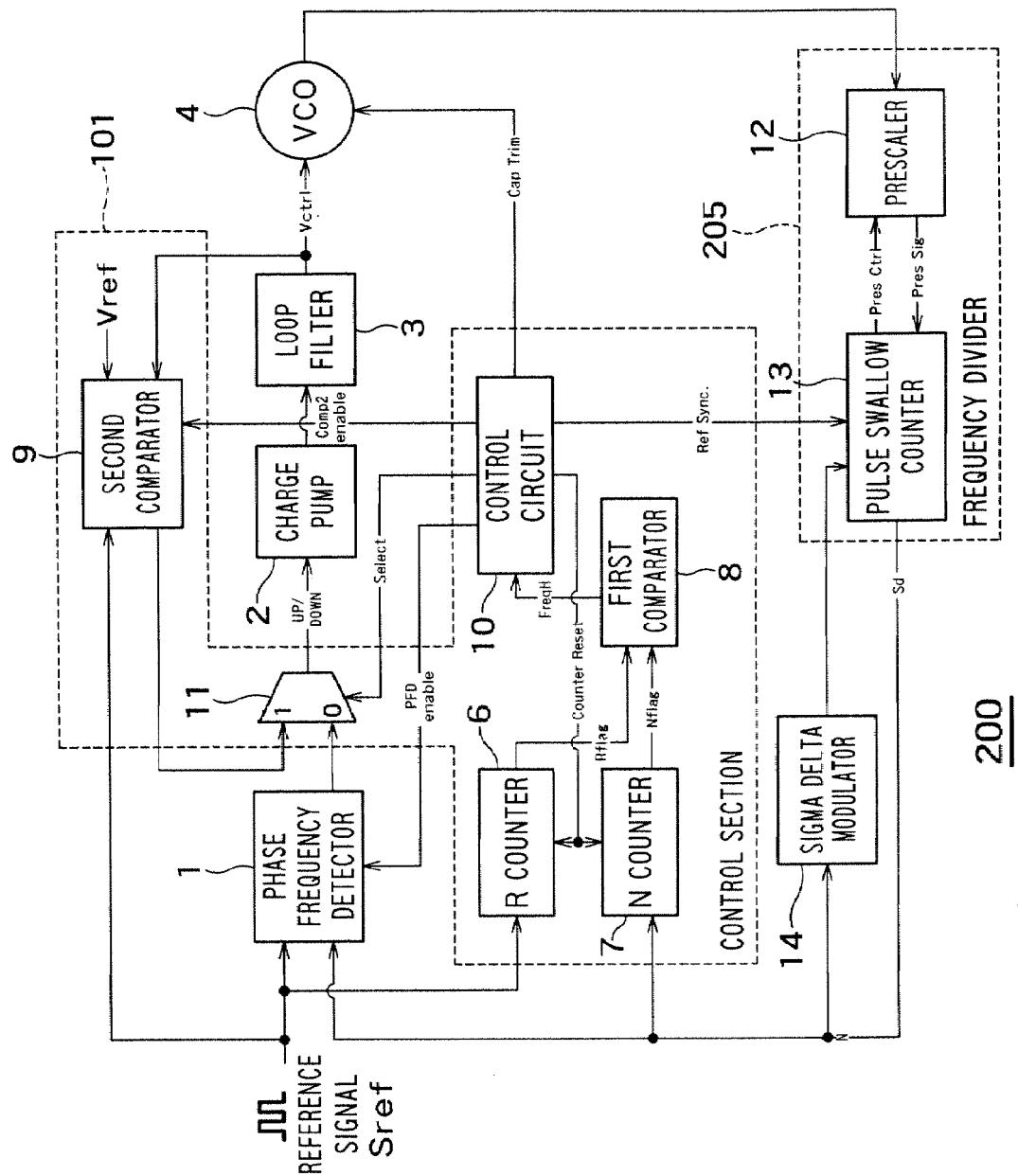
FIG. 10 is a circuit diagram showing a configuration of essential parts of an oscillator controller 200 according to an embodiment 2 of the present invention, which is an aspect of the present invention.

FIG. 10 is a circuit diagram showing a configuration of essential parts of an oscillator controller 200 according to an embodiment 2 of the present invention, which is an aspect of the present invention. In this drawing, the same reference numerals as those in the embodiment 1 denote the same parts as those in the embodiment 1.

As shown in FIG. 10, a frequency divider 205 of the oscillator controller 200 has a prescaler 12 that counts the number of waves of the oscillation signal output from a voltage-controlled oscillator 4 and a pulse swallow counter 13 that receives the output "Pres Sig" of the prescaler 12, outputs a control signal "Pres Ctrl" to control the frequency division ratio of the prescaler 12, and outputs a frequency-divided signal "Sd" according to the output of the prescaler 12.

Furthermore, the oscillator controller 200 has a sigma delta modulator 14 that controls the pulse swallow counter 13 based on the frequency-divided signal "Sd".

The oscillator controller 200 configured as described above controls the voltage-controlled oscillator 4 in the same process flow as shown in FIG. 7. In this process, the pulse swallow counter 13 in the frequency divider 205 is controlled at the same timings as in the embodiment 1 (see FIGS. 8A and 8B) by a control signal "RefSync". The other components are controlled in the same manner as in the embodiment 1.

As described above, as in the embodiment 1, the oscillator controller according to this embodiment can precisely control the voltage-controlled oscillator with reduced circuit area and power consumption.

In particular, in fractional frequency division, there is no need to add a circuit for calculating the frequency ratio between the prescaler output and the reference signal "Sref", and accordingly, the embodiment 2 contributes to the circuit area reduction more than the embodiment 1.

Embodiment 3

In the configurations described above with regard to the embodiments 1 and 2, the second comparator and the multiplexer are used to fix the oscillation frequency controlling voltage at the reference voltage. With regard to an embodiment 3, there will be described another configuration for fixing the oscillation frequency controlling voltage at the reference voltage.

Figure 11:
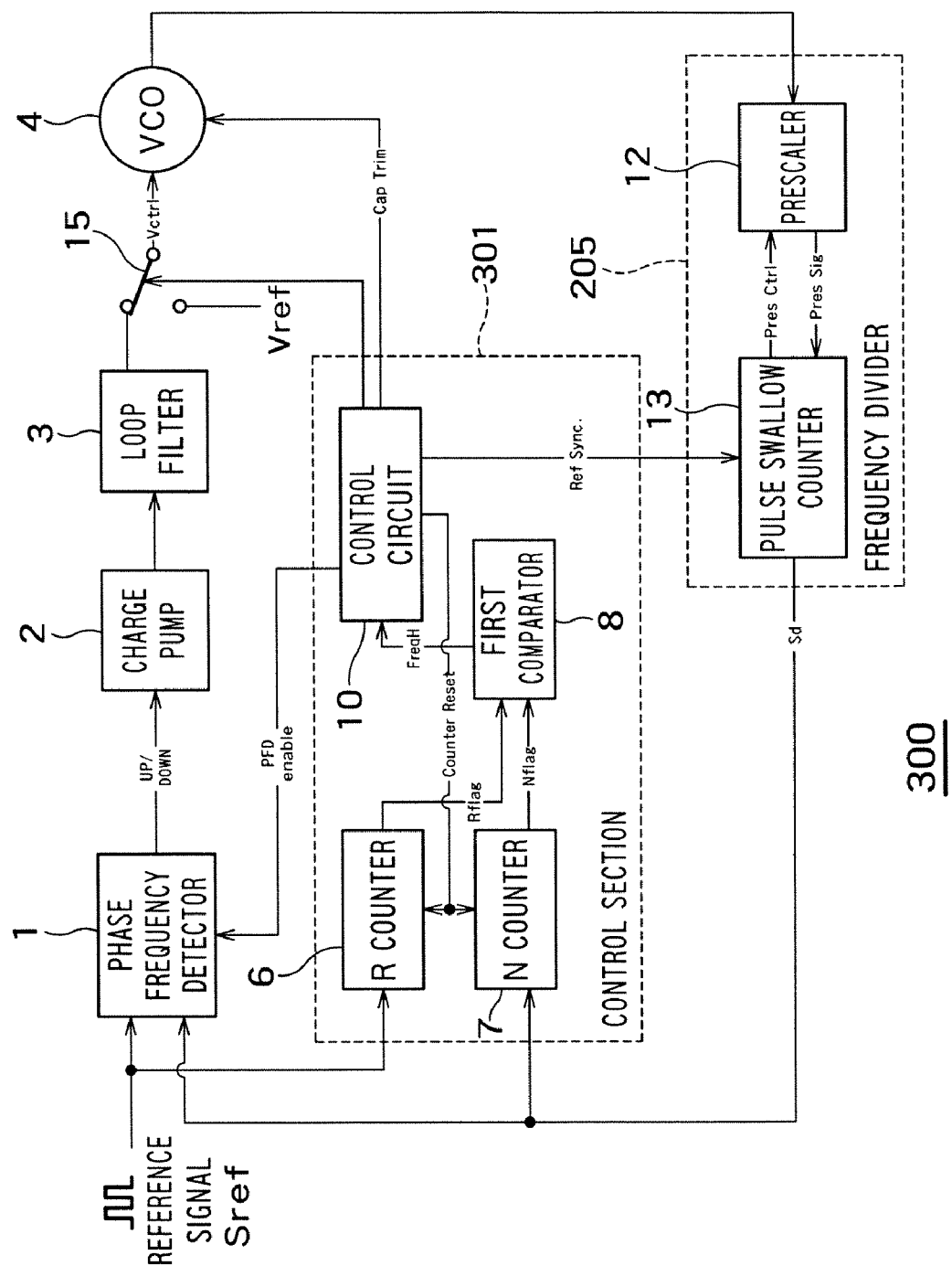
FIG. 11 is a diagram showing a configuration of essential parts of an oscillator controller 300 according to the embodiment 3, which is an aspect of the present invention.

FIG. 11 is a diagram showing a configuration of essential parts of an oscillator controller 300 according to the embodiment 3, which is an aspect of the present invention. In this drawing, the same reference numerals as those in the embodiments 1 and 2 denote the same parts as those in the embodiments 1 and 2. In FIG. 11, illustration of the sigma delta modulator is omitted.

As shown in FIG. 11, the oscillator controller 300 has a switch circuit 15 provided between a loop filter 3 and a voltage-controlled oscillator 4, instead of the second comparator and the multiplexer.

The switch circuit 15 switches between the output of the loop filter and a reference voltage "Vref" based on a control signal from a control circuit 10 and outputs an oscillation frequency controlling voltage "Vctrl" to the voltage-controlled oscillator 4.

The oscillator controller 300 configured as described above controls the voltage-controlled oscillator 4 in the same process flow as shown in FIG. 7, except for the operations involving the second comparator and the multiplexer.

In this process flow, in step "S2", the switch circuit 15 outputs the reference voltage "Vref" to the voltage-controlled oscillator 4 based on the control signal from the control circuit 10.

Furthermore, in step "S7", the switch circuit 15 selects the output of a charge pump 3 and outputs the same to the voltage-controlled oscillator 4, based on the control signal from the control circuit 10.

As described above, as in the embodiments 1 and 2, the oscillator controller according to this embodiment can precisely control the voltage-controlled oscillator with reduced circuit area and power consumption.

Embodiment 4

In the configuration described with regard to the embodiment 3, the oscillator controller controls the voltage-controlled oscillator. The configuration can also be used for adjusting the prescaler. With regard to an embodiment 4, there will be described an operation of the circuit according to the embodiment 3 applied to control of the prescaler and a configuration in which an oscillator controller controls a prescaler.

Figure 12:
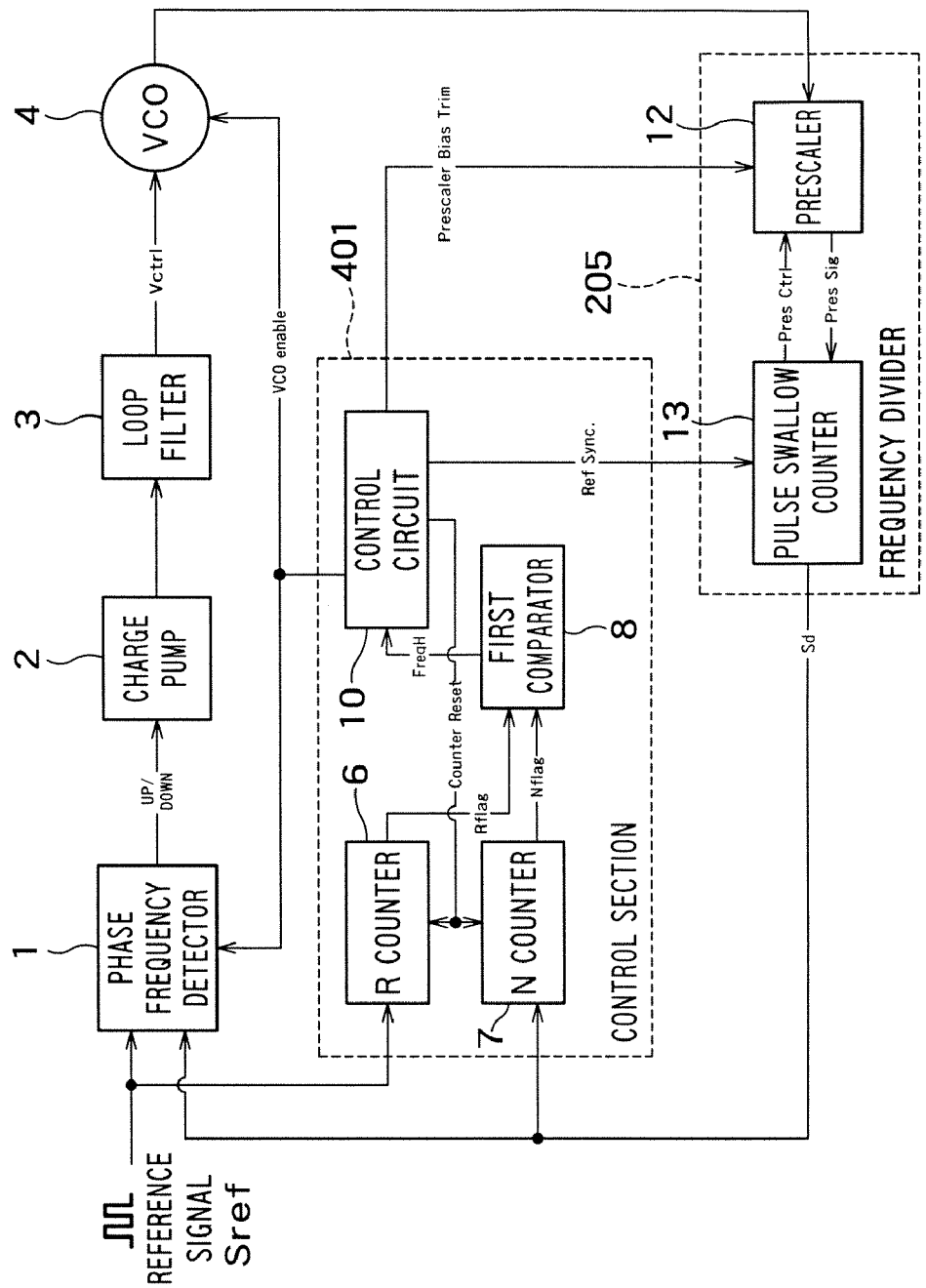
FIG. 12 is a diagram showing a configuration of essential parts of an oscillator controller 400 according to the embodiment 4, which is an aspect of the present invention.

FIG. 12 is a diagram showing a configuration of essential parts of an oscillator controller 400 according to the embodiment 4, which is an aspect of the present invention. In this drawing, the same reference numerals as those in the embodiment 3 denote the same parts as those in the embodiment 3.

As shown in FIG. 12, a control circuit 10 in the oscillator controller 400 outputs a control signal "VCO enable" to start or stop the operation of a voltage-controlled oscillator. Furthermore, the control circuit 10 outputs a control signal "Prescaler Bias Trim" to a prescaler 12 according to a signal "FreqH" output from a first comparator 8, thereby adjusting the free-running oscillation frequency of the prescaler 12 to bring the free-running oscillation frequency close to a desired frequency for synchronization.

In this embodiment, the prescaler 12 has a circuit configuration in which the free-running oscillation frequency and a bias current are correlated with each other. Generally, the prescaler 12 oscillates in a free-running manner, and the sensitivity thereof to the input becomes higher as the frequency approaches the frequency for synchronization.

Now, there will be described a process flow in which the oscillator controller 400 configured as described above controls the prescaler 12 before proceeding to the PLL operation.

Figure 13:
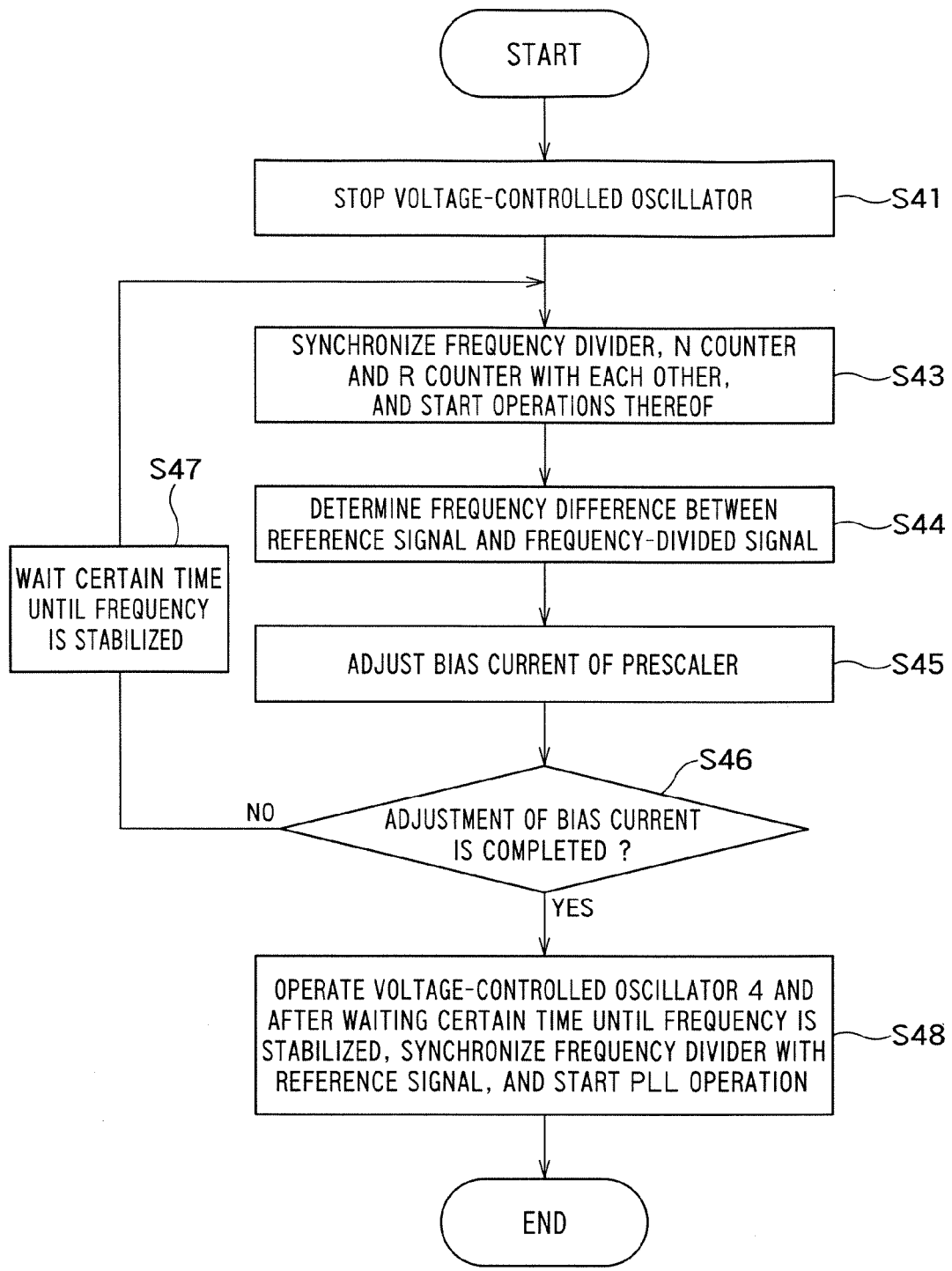
FIG. 13 is a flowchart showing a process flow of controlling a prescaler by the oscillator controller according to the embodiment 4.

FIG. 13 is a flowchart showing a process flow of controlling a prescaler by the oscillator controller according to the embodiment 4. In this process flow, timing waveforms are the same as those shown in FIGS. 8A and 8B.

As shown in FIG. 13, first, the oscillator controller 400 outputs the control signal "VCO enable" to stop a voltage-controlled oscillator 4 (step "S41"). Specifically, when controlling the prescaler 12, the control signal "VCO enable" is set at "Low" to stop the operation of the voltage-controlled oscillator 4.

Then, a pulse swallow counter 13 in a frequency divider 205, an N counter 7 and an R counter 6 are synchronized with each other, and operations thereof are started (step "S43"). The control circuit 10 determines the frequency difference between a reference signal "Sref" and a frequency-divided signal "Sd" based on a first frequency comparison signal "FreqH" from a first comparator 8 and outputs a control signal "Ref Sync" for synchronizing the frequency-divided signal "Sd" with the reference signal "Sref" to the pulse swallow counter 13.

Specifically, the control circuit 10 sets a control signal "Counter Reset" and the control signal "Ref Sync" at "High", sets the N counter 7 and the R counter at an initial values, and maintains the pulse swallow counter 13 at a frequency division ratio setting in the normal operation. The control signal "Ref Sync" is synchronized with the reference signal "Sref", and when the control signal "Ref Sync" becomes "Low", the operation of the frequency divider 5 is started. At this time, the pulse swallow counter 13 starts the operation in synchronization with the reference signal "Sref".

Under these conditions, the R counter 6 and the N counter 7 are operated. Then, a first flag signal "Rflag" and a second flag signal "Nflag" are set at "Low" under the control of the control signal "Counter Reset" output from the control circuit 10, and when the count reaches to an arbitrary preset value "C", the flag signals are set at "High".

Then, the frequency difference between the reference signal "Sref" and the frequency-divided signal "Sd" after the pulse swallow counter 13, the N counter 7 and the R counter 6 are synchronized with each other is determined (step "S44"). After the reference signal "Sref" and the frequency-divided signal "Sd" are synchronized with each other, the control circuit 10 controls the R counter 6 and the N counter 7 to count the number of waves of the reference signal "Sref" and the frequency-divided signal "Sd", respectively, to the desired number "C".

Then, based on a second frequency comparison signal "FreqH" output from the first comparator 8 after the synchronization, the control circuit 10 determines the frequency difference between the reference signal "Sref" and the frequency-divided signal "Sd".

Then, the bias current of the prescaler 12 is adjusted (step "45"). Specifically, the control circuit 10 outputs the control signal "Prescaler Bias Trim" for adjusting the bias current of the prescaler 12 according to the frequency difference between the reference signal "Sref" and the frequency-divided signal "Sd" thereby controlling the free-running oscillation frequency of the prescaler 12 stepwise.

For example, if the second flag signal "Nflag" advances with respect to the first flag signal "Rflag", the control circuit 10 determines that the equivalent input frequency of the free-running oscillation frequency is higher than the preset frequency and adjusts the bias current to lower the frequency.

On the other hand, if the first flag signal "Rflag" advances with respect to the second flag signal "Nflag", the control circuit 10 adjusts the bias current to higher the free-running oscillation frequency.

Then, it is determined whether the adjustment of the bias current of the prescaler 12 is completed (step "S46").

If the adjustment of the bias current of the prescaler 12 is not completed, a certain time is waited until the frequency is stabilized (step "S47"), and then, the process returns to step "S43".

On the other hand, if the adjustment of the bias current of the prescaler 12 is completed, the voltage-controlled oscillator 4 is operated, and after a certain time is waited until the frequency is stabilized, the frequency divider is synchronized with the reference signal, and the PLL operation is started (step "S48").

As described above, the free-running oscillation frequency of the prescaler 12 is set close to the frequency for synchronization, and therefore, thereby improving the sensitivity. As a result, even under conditions where the voltage-controlled oscillator 4 operates at a low voltage or the amplitude of the output of the voltage-controlled oscillator 4 decreases, the PLL operation can be achieved with higher reliability.

As described above, the oscillator controller according to this embodiment can perform the PLL operation with higher reliability with reduced circuit area and power consumption.

Embodiment 5

With regard to the embodiment 1, there has been described a configuration in which an oscillator controller controls a voltage-controlled oscillator. With regard to an embodiment 5, there will be described a configuration in which an oscillator controller controls a ring oscillator.

Figure 14:
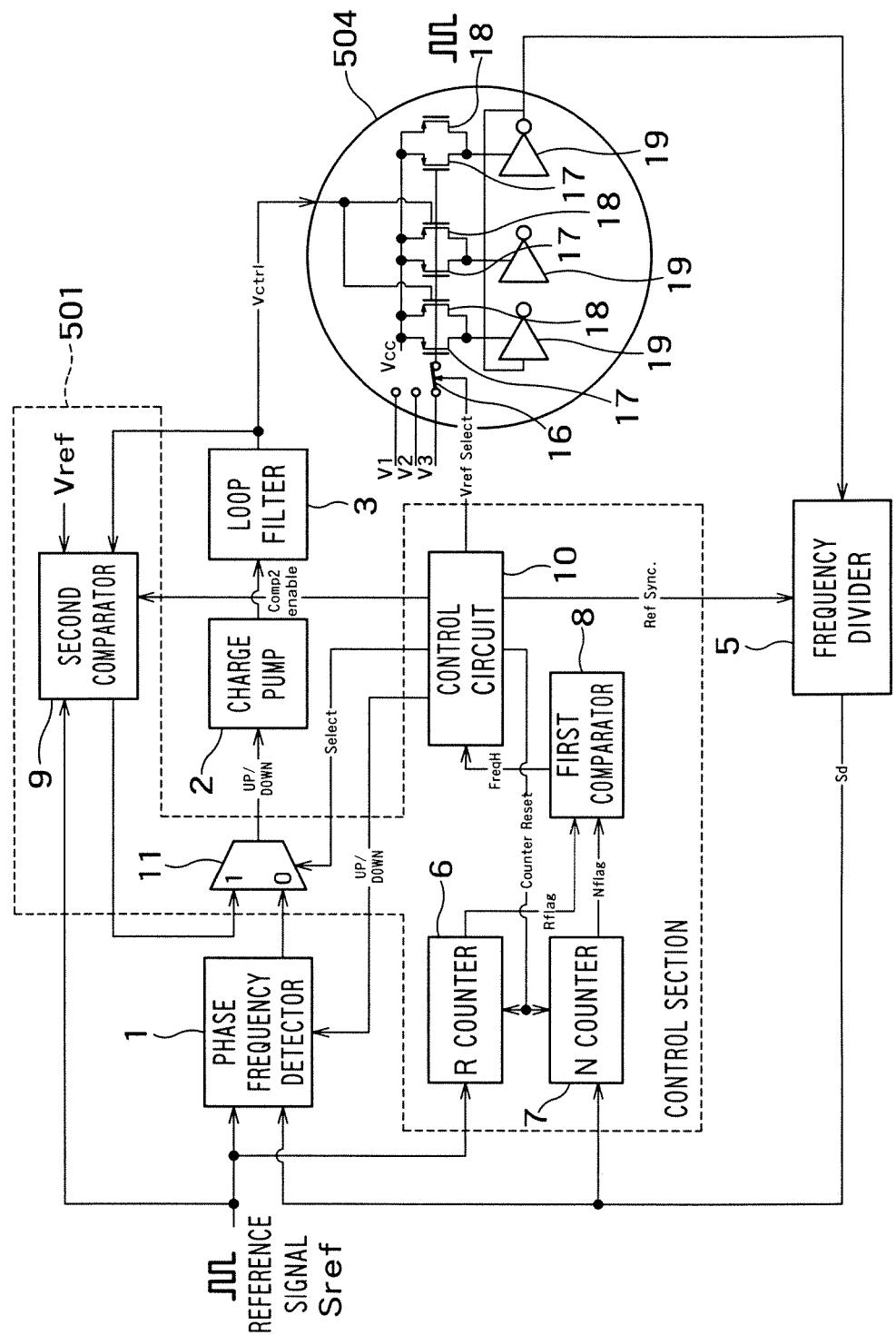
FIG. 14 is a diagram showing a configuration of essential parts of an oscillator controller 500 according to the embodiment 5, which is an aspect of the present invention.

FIG. 14 is a diagram showing a configuration of essential parts of an oscillator controller 500 according to the embodiment 5, which is an aspect of the present invention. In this drawing, the same reference numerals as those in the embodiment 1 denote the same parts as those in the embodiment 1.

As shown in FIG. 14, the oscillator controller 500 has a ring oscillator 504, instead of a voltage-controlled oscillator.

The ring oscillator 504 has a switch 16 that selects one of a plurality of fixed voltages "V1" to "V3" and outputs the selected fixed voltage, a first transistor 17 that has one end connected to a power supply potential "VCC" and is controlled by the output voltage of the switch 16, a second transistor 18 that has one end connected to the power supply potential "VCC" and is controlled by an oscillation frequency controlling voltage "Vctrl", and an odd number of inverters 19 connected to each other in a ring arrangement each of which is connected to the opposite ends of the first and second transistors 17, 18 to be supplied with a control current.

By controlling the second transistor 18 by the oscillation frequency controlling voltage "Vctrl", the control current of the ring oscillator 504 is adjusted, and the oscillation frequency of the ring oscillator 504 is controlled.

The oscillator controller 500 configured as described above controls the ring oscillator 504 in a process flow similar to that shown in FIG. 7.

In the process flow shown in FIG. 7, in step "S5", the control circuit 10 outputs a signal "Vselect" for controlling the switch 16 to the ring oscillator 504 according to the frequency difference determined. As a result, the first transistor 17 is controlled, and thus, the control current is adjusted, and the oscillation frequency of the ring oscillator 504 is controlled. The remaining steps are the same as those in FIG. 7.

As described above, as in the embodiment 1, the oscillator controller according to this embodiment can precisely control the ring oscillator with reduced circuit area and power consumption.

What is claimed is:

1. An oscillator controller, comprising:

a phase frequency detector that compares a reference signal and a frequency-divided signal and outputs a phase difference signal;

a charge pump that outputs a phase error signal according to the phase difference signal output from said phase frequency detector;

a loop filter that filters the phase error signal output from said charge pump and outputs an oscillation frequency controlling voltage;

a voltage-controlled oscillator that has an LC resonator having a coil, a variable capacitor connected to the opposite end of the coil at the opposite ends thereof, and a capacitor connected in series with a switch between the opposite end of said variable capacitor, the oscillation frequency of the voltage-controlled oscillator being controlled through adjustment of the capacitance value of said variable capacitor by said oscillation frequency controlling voltage;

a frequency divider that divides the frequency of the output of said voltage-controlled oscillator and outputs said frequency-divided signal;

a first counter that counts the number of waves of said reference signal to a desired number and outputs a first flag signal;

a second counter that counts the number of waves of said frequency-divided signal to said desired number and outputs a second flag signal;

a first comparator that compares said first flag signal and said second flag signal and outputs a frequency comparison signal; and a control circuit that controls said voltage-controlled oscillator, said first counter, said second counter and said frequency divider by outputting signals thereto, a second comparator that receives a reference voltage and said oscillation frequency controlling voltage and outputs a signal synchronized with said reference signal; and a multiplexer that selects one of the output signal from the second comparator and the output signal from said phase frequency detector based on a selection signal from said control circuit and outputs the selected one to said charge pump.

2. The oscillator controller according to claim 1, wherein said control circuit:

determines the frequency difference between said reference signal and said frequency-divided signal based on a first frequency comparison signal from said first comparator and outputs a signal for synchronizing said frequency-divided signal with said reference signal to said frequency divider;

controls said first counter and said second counter to count the number of waves of said reference signal and said frequency-divided signal, respectively, to said desired number after said reference signal and said frequency-divided signal are synchronized with each other;

determines the frequency difference between said reference signal and said frequency-divided signal based on a second frequency comparison signal output from said first comparator after the synchronization; and outputs a signal for controlling the on/off state of said switch to said voltage-controlled oscillator according to the frequency difference, thereby controlling the oscillation frequency of said voltage-controlled oscillator.

3. The oscillator controller according to claim 1, wherein said frequency divider has a prescaler that counts the number of waves of an oscillation signal output from said voltage-controlled oscillator and a pulse swallow counter that receives the output of the prescaler, controls the frequency division ratio of said prescaler, and outputs said frequency-divided signal according to the output of said prescaler.

* * * * *